United States Patent [19]

Batra et al.

[11] Patent Number: 4,635,118
[45] Date of Patent: Jan. 6, 1987

[54] INTERFACE CIRCUIT FOR VIDEO SIGNAL PEAKING CONTROL

[75] Inventors: Ram S. Batra, Carmel; Kenneth A. Pitcher, Indianapolis, both of Ind.

[73] Assignee: RCA Corporation, Princeton, N.J.

[21] Appl. No.: 695,299

[22] Filed: Jan. 28, 1985

[51] Int. Cl.[4] .......................... H04N 5/14; H04N 5/208
[52] U.S. Cl. ........................................ 358/166; 358/37
[58] Field of Search ................... 358/166, 37, 38, 904, 358/162

[56] References Cited

U.S. PATENT DOCUMENTS 4,388,648 6/1983 Harwood et al. .................... 358/166
4,399,460 8/1983 Harwood et al. ................ 358/37 X Primary Examiner—James J. Groody
Assistant Examiner—E. Anne Toth
Attorney, Agent, or Firm—P. J. Rasmussen; P. M. Emanuel; R. H. Kurdyla

[57] ABSTRACT

A DC coupled system for automatically controlling the peaking content of a video signal includes a frequency selective peaking amplifier, a source of control voltage for controlling the conduction of the amplifier, and an interface circuit including a high output impedance current source network for coupling the control voltage to the amplifier. The interface circuit prevents the amplifier from being loaded excessively by the impedance of the source of control voltage, and assists to assure that the amplifier exhibits negligible gain for DC conditions.

10 Claims, 1 Drawing Figure

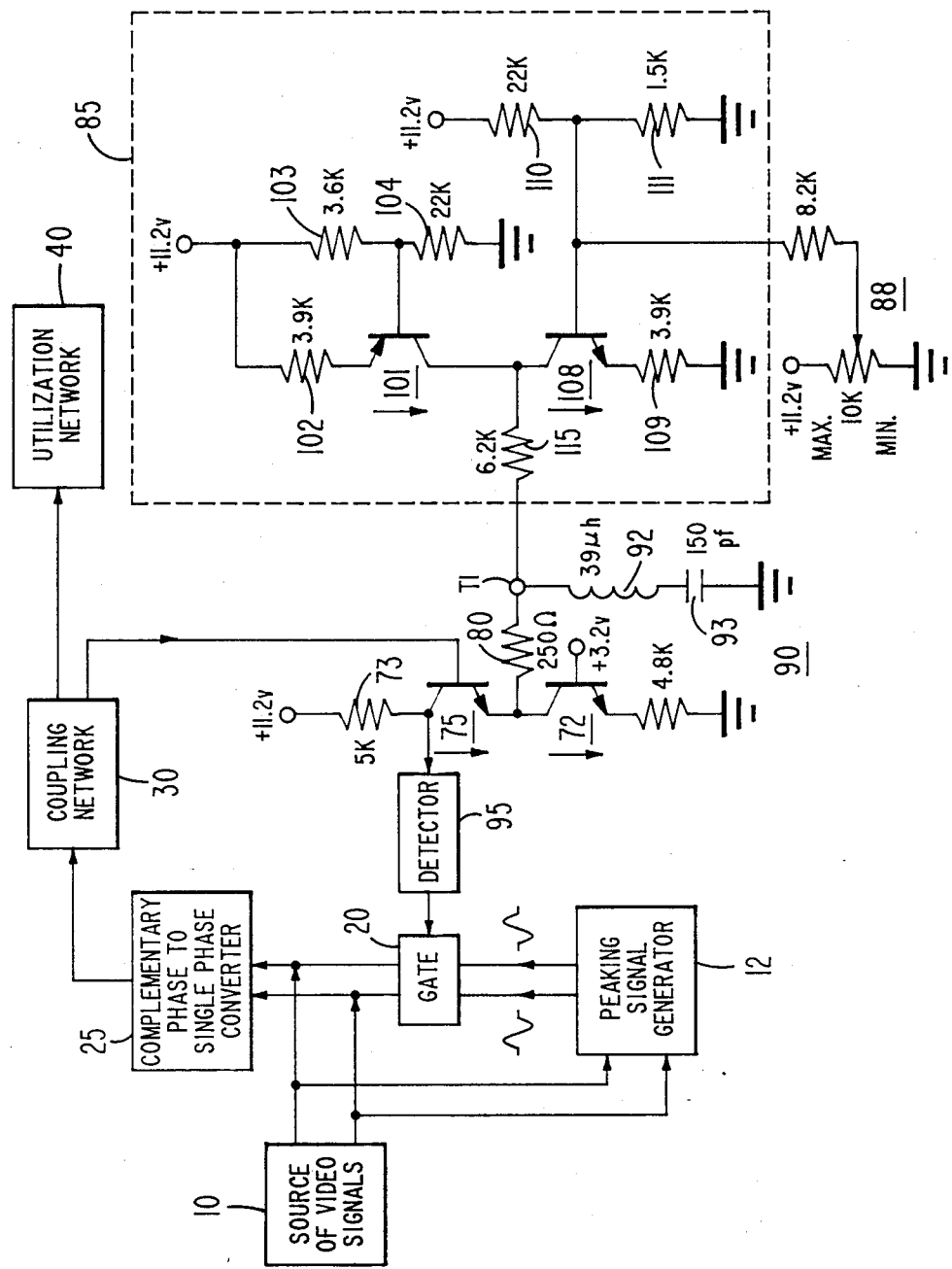

INTERFACE CIRCUIT FOR VIDEO SIGNAL PEAKING CONTROL

This invention concerns an interface circuit for coupling an adjustable peaking control device to a network which controls the amount of video signal peaking in a television receiver or similar system.

The fine detail of an image developed in response to video signals processed by a television receiver can be subjectively improved or enhanced by increasing the slope or "steepness" of video signal amplitude transitions. Such enhancement, commonly referred to as signal "peaking", is typically asssociated with high frequency information of the video signal. For example, horizontal image peaking can be achieved by generating a signal "pre-shoot" just before an amplitude transition, and a signal "over-shoot" just after an amplitude transition, so that black-to-white and white-to-black video signal amplitude transitions are accentuated to produce a "sharper" image.

It is desirable to automatically control the amount of video signal peaking as a function of the high frequency content of a video signal including detail and peaking components from various origins, to optimize the amount of video signal peaking consistent with an objective of providing a reproduced image with good image detail for various signal conditions. It is also often desirable to construct the automatic peaking control system in DC coupled rather than AC coupled form to avoid the use of costly AC coupling capacitors and to facilitate the construction of the peaking control system as an integrated circuit.

It is additionally desirable for a DC coupled automatic peaking control system to respond to a prescribed range of high frequency video signal components, representative of video signal peaking components, to the substantial exclusion of low frequency components including DC components which would otherwise distort or obscure a control voltage developed by the system to indicate the amount of high frequency peaking information present in the video signal. Thus although DC coupled peaking control apparatus is desirable as noted above, DC coupling complicates the system design particularly with respect to the need for exhibiting significant insensitivity to the DC component of the video signal.

A DC coupled automatic peaking control system which is advantageously capable of exhibiting significant insensitivity to the DC component of a video signal is described in U.S. Pat. No. 4,388,648 of L. A. Harwood, et al. In a system of that type, a peaking control error may result as a function of the video signal DC component, the setting of a manually adjustable peaking control device, and the signal gain of the peaking control loop. The amount of such peaking control error is normally insignificant in a system with low to moderate control loop gains, but for high loop gain the error may increase to an unacceptably high level.

Thus in accordance with the principles of the present invention there is disclosed herein an arrangement which substantially prevents peaking control errors from being developed as a peaking control device is adjusted, even in the presence of high control loop gain, and which may be advantageously used in conjunction with an automatic peaking control system of the type described in U.S. Pat. No. 4,388,648. Specifically, in the presently disclosed system the adjustable peaking control device is coupled to a control terminal in the peaking control loop via an active interface circuit with a high output impedance to prevent the control terminal from being loaded excessively by the impedance of adjustable control device. The high impedance interface circuit also assures that a peaking amplifier in the peaking control loop exhibits negligible gain for DC conditions.

In an implementation of the present invention, the peaking control system includes a filter for shaping the frequency response of the system. The filter is connected to the system via the same control terminal to which the adjustable control device is coupled via the interface circuit, and the filter and the adjustable control device exhibit mutually independent operation.

In accordance with a feature of the invention, the peaking amplifier in the control loop is DC coupled and comprises an upper rank amplifier transistor responsive to video signals, and a lower rank transistor which serves as a current source for the amplifier transistor. The filter and the adjustable peaking control are coupled via the control terminal to the output of the current source transistor, at the junction of the amplifier and current source transistors. In a preferred embodiment the filter comprises a series tuned LC circuit coupled between the control terminal and a point of reference potential.

The sole FIGURE of the drawing shows a DC coupled automatic peaking control system in a television receiver, partly in block diagram form and partly in schematic circuit diagram form, including a peaking control interface circuit in accordance with the present invention. With the exception of the interface circuit, the illustrated system corresponds to that shown and described in detail in U.S. Pat. No. 4,388,648-Harwood et al., incorporated by reference herein.

Complementary phased (i.e., push-pull) video signals are provided from a source 10. Complementary phased peaking signals are provided from a peaking signal generator 12 in response to the complementary phased video signals from source 10. The peaking signals are coupled to respective inputs of a controlled variable conduction gate 20. The video signals from source 10 are combined with peaking signals from the output of gate 20 to produce complementary phased peaked video signals. These signals are converted to a single phase peaked video signal by means of a network 25. The latter signal is coupled via a network 30 to a video signal utilization network 40, which includes signal processing stages for developing a video signal suitable for application to an image display device of the receiver.

The peaked video signal supplied to utilization network 40 contains high frequency information including peaking components attributable to various factors. The video signal also includes a DC component which varies with the picture information content of the video signal. A portion of the peaked video signal conveyed by coupling network 30 is DC coupled to a peaking amplifier transistor 75 which, together with a peak amplitude detector 95, completes a DC coupled peaking control loop which also includes networks 20, 25 and 30.

Transistor 75 serves as a frequency selective signal amplifier for peaking control purposes, with a signal gain determined by the ratio of its collector circuit impedance to its emitter circuit impedance. The collector circuit impedance of transistor 75 is established by the value of a resistor 73. The emitter circuit of transistor 75 comprises a current sink transistor 72 (which also may be thought of as a current source transistor supplying negative currents) which determines the operating current for transistor 75, a resistor 80, a bandpass peaking filter network 90 coupled to a terminal T1, and an adjustable peaking control network including a viewer adjustable peaking control potentiometer 88 and an interface circuit 85 for coupling potentiometer 88 to terminal T1. Within a a given range of video signal high frequencies the impedance between the emitter transistor 75 and ground, and thereby and signal gain of transistor 75, are primarily determined by the impedance of filter 90 and by resistor 80 for all settings of control potentiometer 88.

As will be discussed in detail subsequently, interface circuit 85 presents a very high DC impedance to control terminal T1 to assure that the signal gain of transistor 75, as determined by the ratio of its collector impedance to its emitter impedance, is negligible for DC conditions. Thus interface network 85 serves to prevent the peaking control signal developed by the control loop from being distorted by the DC component of the video signal for any setting of control potentiometer 88. In order to appreciate the role of interface circuit 85 it will be helpful to understand the operation of the peaking control loop, particularly under DC conditions.

Peaking filter 90 includes a series resonant combination of an inductor 92 and a capacitor 93, coupled between the emitter of transistor 75 and a point of reference potential (ground). Filter 90 illustratively exhibits a center frequency of approximately 2 MHz and a bandwidth of approximately 1 MHz. This filter characteristic determines the frequency response of the amplifier stage including transistor 75 and thereby the frequency response of the peaking control loop.

Filter 90 exhibits a relatively small impedance in response to signal frequencies between 1.5 MHz and 2.5 MHz, with a minimum impedance (essentially a short-circuit) in response to signals at the 2 MHz resonant frequency of filter 90. Thus within the bandwidth of filter 90 the impedance at the emitter transistor 75 is significantly less than the collector impedance of transistor 75. In such case the impedance at the emitter of transistor 75 corresponds to the sum of the impedance of filter 90 and the small value of resistor 80, since transistor 72 and network 85 each present a very high impedance in shunt with the emitter of transistor 75. Thus transistor 75 exhibits significant gain at signal frequencies between 1.5 MHz and 2.5 MHz, corresponding to frequencies with which most of the video signal high frequency information including peaking components are associated, and exhibits a maximum gain at the 2 MHz resonant frequency of filter 90. The maximum gain can be adjusted by tailoring the value of resistor 80.

At lower video signal frequencies including DC, the impedance of filter 90 and thereby the emitter impedance of transistor 75 increase greatly, whereby the gain of transistor 75 decreases correspondingly and low frequency signals are greatly attenuated at the collector output of transistor 75. In particular, amplifier 75 exhibits negligible signal gain at DC, when filter 90 exhibits an extremely large maximum impedance (essentially an open circuit) due to the DC blocking action of capacitor 90. Also, the collector of current source transistor 72 and the output of interface circuit 85 present very high impedances, on the order of several hundred kilohms to one megohm, to the emitter of transistor 75. Accordingly, the disclosed arrangement represents an advantageous mechanism for suppressing low frequency video signal components, and particularly DC components, in the DC coupled control path. High frequency signals above 3.0 MHz will also be attenuated by the selectivity of filter 90.

The high frequency signals passed by transistor 75 are detected by peak amplitude detector 95. An output DC control voltage from detector 95 is proportional to the selected high frequency content of the video signal, including peaking components. This control voltage is applied to variable conduction gate 20 for controlling the amount of peaking signal which is conducted from generator 12 to the video signal from source 10. The amount of peaking imparted to the video signal is therefore maintained within desired limits, consistent with the setting of adjustable peaking control potentiometer 88. The amount of peaking imparted to the video signal can be adjusted manually by means of peaking control 88, which together with interface circuit 85 serves to control the amount of current conducted by transistor 75 and thereby modifies the control voltage developed by detector 95.

Interface circuit 85 includes a constant current source with a PNP transtor 101 and associated biasing resistors 102, 103 and 104, and a variable current sink (which may also be thought of as a current source supplying a negative current) with an NPN transistor 108 and associated biasing resistors 109, 110 and 111. The high impedance interconnected collector outputs of current source transistors 101 and 108 are connected to peaking control terminal T1 via a coupling resistor 115.

In the following description it will be helpful to refer to the arrows next to transistors 72,75,101 and 108 which indicate the direction of positive current flow. Adjustment of peaking control 88 varies the magnitude of current conducted by transistor 108, which in turn varies the DC current conduction of amplifier transistor 75. Varying the DC current conduction of transistor 75 causes the DC voltage developed across resistor 73 at the collector of transistor 75 to change, thereby varying the DC voltage output from detector 95. The magnitude of the peaking signal output from gate 20 changes as the DC voltage output from detector 95 changes, corresponding to a change in the gain of the peaking control loop. Transistor 108 acts as a source of current (that is, negative current) for amplifier transistor 75 as explained below by providing an increased magnitude of DC operating current for transistor 75 when it is intended to increase the current conduction of transistor 75 by adjusting control device 88 from its minimum (MIN) to its maximum (MAX) setting.

Transistor 108 is cut-off but close to conducting when potentiometer 88 is at the minimum peaking setting (MIN). At this time interface circuit 85 provides a DC current to the peaking control network from the collector of current source transistor 101 via resistor 115, terminal T1 and resistor 80, and constant current source transistor 72 conducts a current equal to the sum of the constant DC current provided by current source transistor 101 plus the emitter current of amplifier transistor 75.

In this example transistor 101 conducts a constant current of approximately 250 microamperes, and transistor 108 conducts a variable current of from zero to approximatley 450 microamperes. Transistor 108 is caused to conduct and exhibits increasing current conduction in a linear region as control potentiometer 88 is adjusted from the minimum peaking setting to the maximum peaking setting (MAX) to increase the amount of peaking imparted to the video signal. As the conduction of transistor 108 increases, transistor 108 conducts an increasing portion of the current from transistor 101, whereby correspondingly less current is conducted from the collector of transistor 101 to the emitter of transistor 75 via resistor 115, terminal T1 and resistor 80. Since transistor 72 is a constant current source (of negative current), this action permits amplifier transistor 75 to conduct a corresponding additional current which produces increased control loop signal gain at the peaking frequencies.

At some given point, e.g., when the wiper of potentiometer 88 is in the vicinity of a mid-range setting, the current conducted by transistor 108 equals the current conducted by transistor 101 whereby no current flows in the current path including resistor 115, terminal T1 and resistor 80. Between this point and the maximum peaking position of potentiometer 88, the increasing current conduction level of transistor 108 exceeds the current conduction level of transistor 101, and current now flows from the emitter of amplifier transistor 75 to the collector of transistor 108 via resistor 80, terminal T1 and resistor 115. The increased current now conducted by transistor 108 exceeds the current provided by source transistor 72 and is associated with an increase in the emitter current of amplifier transistor 75, which produces an increase in the signal gain of the control loop at peaking frequencies.

At the minimum peaking setting of potentiometer 88, when transistor 108 is at or near cutoff, for DC signal conditions such as in response to the DC component of a video signal applied to the base of transistor 75, transistor 75 advantageously exhibits negligible DC signal gain due to the very high impedance presented to the emitter of transistor 75 for DC conditions. Such impedance is established by the very high (at least several hundred kilohms) collector impedances of current source transistors 101 and 72, and by the very high (open circuit) impedance presented by filter 90. Accordingly, transistor 75 is desirably substantially unresponsive to DC signal components appearing at its base input electrode, and the peaking control voltage developed by detector 95 is not affected by such DC components. At the peaking fequencies the signal gain of transistor 75 is related to the reduced emitter circuit impedance of transistor 75 as determined by filter 90.

While transistor 108 conducts, amplifier transistor 75 continues to exhibit negligible DC gain due to the very high impedance presented to the emitter of transistor 75 under DC conditions, i.e., due to the very high (several hundred kilohm) collector impedances of transistors 72, 101 and 108 and the essentially open-circuit impedance of filter 90 at DC.

The desired high output impedance of interface circuit 85, as appearing at the interconnected collectors of transistors 101 and 108, can be achieved by employing commonly available general purpose, low power, low frequency transistors for transistors 101 and 108. Such transistors typically exhibit a DC collector impedance of several hundred kilohms and greater when operated at low to moderate current levels. The collector DC impedance may vary as the transistor conduction level is caused to vary. However, acceptably small or negligible variations can normally be expected when the variable conduction transistor is operated at moderate to low current levels, and such variations, if present, do not compromise the objective of interface network 85 due to the very high output impedance involved.

As noted in U.S. Pat. No. 4,388,648-Harwood et al., the combination of transistors 72 and 75 arranged as shown with filter 90 represents an advantageous means for shaping the frequency response of the DC coupled peaking control loop, particularly with respect to suppressing DC components in the video signal coupled to detector 95 via transistor 75. The DC component of the video signal varies with the picture information content of the video signal, and would undesirably distort or obscure the control voltage developed by detector 95.

Interface network 85 in accordance with the principles of the present invention enhances the utility of the arrangement including transistors 72 and 75 and filter 90, particularly in peaking control systems which require a high gain peaking control loop. As discussed above, interface 85 assists to render the peaking control loop substantially insensitive to video signal DC components by essentially isolating the peaking control loop from loading by the adjustable peaking control device which would otherwise tend to increase the signal gain at DC.

Additional advantageous aspects of the peaking control system including transistors 72 and 75 together with filter 90 are described in detail in the aforementioned Harwood, et al. patent.

What is claimed is:

1. A frequency selective video signal processor responsive to video signals including high frequency and DC components for developing an output video signal encompassing a given range of video signal high frequency components to the substantial exclusion of video signal DC components, comprising:
   a gain controllable amplifier with a signal input responsive to said video signals including said DC component, a control input, and a signal output coupled to a load impedance;
   a source of current coupled to said control input of said amplifier for providing operating current for said amplifier;
   a filter coupled between said control input of said amplifier and a reference potential, said filter exhibiting a first impedance at DC such that said amplifier exhibits a first gain at DC, and a second impedance at a frequency within said given frequency range such that said amplifier then exhibits a second gain substantially greater than said first gain;
   a source of control signal; and
   an interface circuit for coupling said control signal to said amplifier, said interface circuit comprising an active current source network with an input coupled to said source of control signal, and a high impedance output coupled to said control input of said amplifier for coupling said control signal to said amplifier to control the conduction thereof.

2. Apparatus according to claim 1, wherein said active current source network provides an output current of one polarity over a first range of magnitudes of said control signal, and an output current of another polarity over a second range of magnitudes of said control signal.

3. Apparatus according to claim 1, wherein said active current source network comprises first and second series connected active current conducting devices with interconnected high impedance outputs coupled to said control input of said amplifier.

4. Apparatus according to claim 3, wherein
said first active device comprises a first transistor of one conductivity type with a base electrode, an emitter electrode and a high impedance collector electrode; and
said second active device comprises a second transistor of an opposite conductivity type with a base electrode, an emitter electrode and a high impedance collector electrode connected to said collector electrode of said first transistor.

5. Apparatus according to claim 4, wherein
said control signal is coupled to said base electrode of said first transistor for varying the conduction thereof; and
said second transistor is biased to conduct a substantially constant current.

6. Apparatus according to claim 1, wherein
said gain controllable amplifier comprises an amplifier transistor with a base electrode corresponding to said signal input, a low impedance emitter electrode corresponding to said control input, and a collector electrode corresponding to said signal output.

7. Apparatus according to claim 6, wherein
said source of operating current coupled to said control input of said gain controllable amplifier comprises a current source transistor with a high impedance output coupled to said control input.

8. Apparatus according to claim 7, wherein
said filter comprises a series resonant filter coupled to said emitter electrode of said amplifier transistor.

9. Apparatus according to claim 8, wherein
said filter comprises the series combination of an inductor and a capacitor coupled between said emitter electrode of said amplifier transistor and a reference potential.

10. Apparatus according to claim 1, wherein
said gain controllable amplifier is DC coupled.

* * * * *